United States Patent
Heaton

(10) Patent No.: US 7,969,186 B2
(45) Date of Patent: Jun. 28, 2011

(54) APPARATUS AND METHOD FOR FORMING A MIXED SIGNAL CIRCUIT WITH FULLY CUSTOMIZABLE ANALOG CELLS AND PROGRAMMABLE INTERCONNECT

(75) Inventor: Robert Heaton, Dana Point, CA (US)

(73) Assignee: MIPS Technologies, Sunnyvale, CA (US)

( * ) Notice: Subject to any disclaimer, the term of this patent is extended or adjusted under 35 U.S.C. 154(b) by 37 days.

(21) Appl. No.: 12/477,059

(22) Filed: Jun. 2, 2009

(65) Prior Publication Data

US 2010/0301897 A1 Dec. 2, 2010

(51) Int. Cl.
H03K 19/173 (2006.01)
H01L 27/082 (2006.01)

(52) U.S. Cl. ............ 326/38; 326/37; 257/553; 257/296

(58) Field of Classification Search ............... 326/38–41; 257/296, 553
See application file for complete search history.

(56) References Cited

U.S. PATENT DOCUMENTS

| | | | |
|---|---|---|---|
| 5,107,146 A | 4/1992 | El-Ayat | |
| 5,821,776 A | 10/1998 | McGowan | |
| 5,959,871 A * | 9/1999 | Pierzchala et al. | 703/4 |
| 6,460,172 B1 | 10/2002 | Insenser Farre et al. | |
| 6,724,220 B1 | 4/2004 | Snyder et al. | |
| 7,305,646 B2 | 12/2007 | McGrath et al. | |
| 7,761,845 B1 * | 7/2010 | Perrin et al. | 717/109 |
| 7,834,428 B2 * | 11/2010 | Secareanu et al. | 257/665 |
| 7,865,850 B1 * | 1/2011 | Kao et al. | 716/136 |
| 2002/0108006 A1 * | 8/2002 | Snyder | 710/100 |
| 2003/0080777 A1 * | 5/2003 | Baxter | 326/39 |
| 2004/0016977 A1 * | 1/2004 | Miyazaki et al. | 257/393 |
| 2005/0237083 A1 * | 10/2005 | Bakker et al. | 326/47 |
| 2006/0261846 A1 * | 11/2006 | Twigg et al. | 326/37 |
| 2008/0204120 A1 * | 8/2008 | Park | 327/530 |

OTHER PUBLICATIONS

Borghetti et al., "A Hybrid Nanomemristor/Transistor Logic Circuit Capable of Self-Programming", PNAS, Feb. 10, 2009, 106(6):1699-1703.

* cited by examiner

Primary Examiner — Vibol Tan
(74) Attorney, Agent, or Firm — Cooley LLP

(57) ABSTRACT

A mixed signal integrated circuit includes a digital logic array and an analog cell array. Each cell of the analog cell array shares a common architecture and is fully programmable. An analog cell includes mirror NFETs, cascode NFETs, differential pair NFETs, differential pair PFETs, cascode PFETs and mirror PFETs. An analog cell may also include special purpose components, such as low value resistors, high value resistors and PFETs.

19 Claims, 6 Drawing Sheets

APPARATUS AND METHOD FOR FORMING A MIXED SIGNAL CIRCUIT WITH FULLY CUSTOMIZABLE ANALOG CELLS AND PROGRAMMABLE INTERCONNECT

FIELD OF THE INVENTION

This invention relates generally to integrated circuits that process analog and digital signals. More particularly, this invention relates to a mixed signal circuit with fully customizable analog cells and programmable interconnect.

BACKGROUND OF THE INVENTION

A mixed signal integrated circuit has both analog circuits and digital circuits on a single semiconductor die. Examples of mixed signal integrated circuits include data converters using delta-sigma modulation, analog-to-digital converters, digital-to-analog converters, digital radio chips, and digitally controlled sound chips.

Because of the use of both digital signal processing and analog circuitry, mixed signal integrated circuits are usually designed for a very specific purpose and their design requires a high level of expertise and careful use of Computer Aided Design (CAD) tools. Automated testing of the finished chips can be challenging.

There are a number of design challenges associated with mixed signal integrated circuits. For example, CMOS technology is usually optimal for digital performance and scaling while bipolar transistors are usually optimal for analog performance, yet until recently it has been difficult to either combine these cost-effectively or to design both analog and digital circuits in a single technology without serious performance trade-offs. The advent of technologies like high performance CMOS, BiCMOS, CMOS SOI and SiGe has removed many of these trade-offs, thereby presenting new opportunities for mixed signal circuits.

Still, problems remain. For example, testing the functional operation of mixed-signal integrated circuits remains complex, expensive and often a "one-off" implementation task. In addition, systematic design methodologies comparable to digital design methods are far more primitive in the analog and mixed signal arena. Analog circuit design cannot be automated to the same extent as digital circuit design. Combining the two technologies multiplies automation complication.

Mixed signal circuits with fixed function analog cells are known. The fixed function analog cells may have programmable interconnect to implement various analog operations. Unfortunately, such designs have limited flexibility and consume relatively large amounts of chip space. Accordingly, it would be desirable to provide an improved mixed signal circuit.

SUMMARY OF THE INVENTION

A mixed signal integrated circuit includes a digital logic array and an analog cell array. Each cell of the analog cell array shares a common architecture and is fully programmable. An analog cell includes mirror NFETs, cascode NFETs, differential pair NFETs, differential pair PFETs, cascode PFETs and mirror PFETs. An analog cell may also include special purpose components, such as low value resistors, high value resistors NFETs and PFETs.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
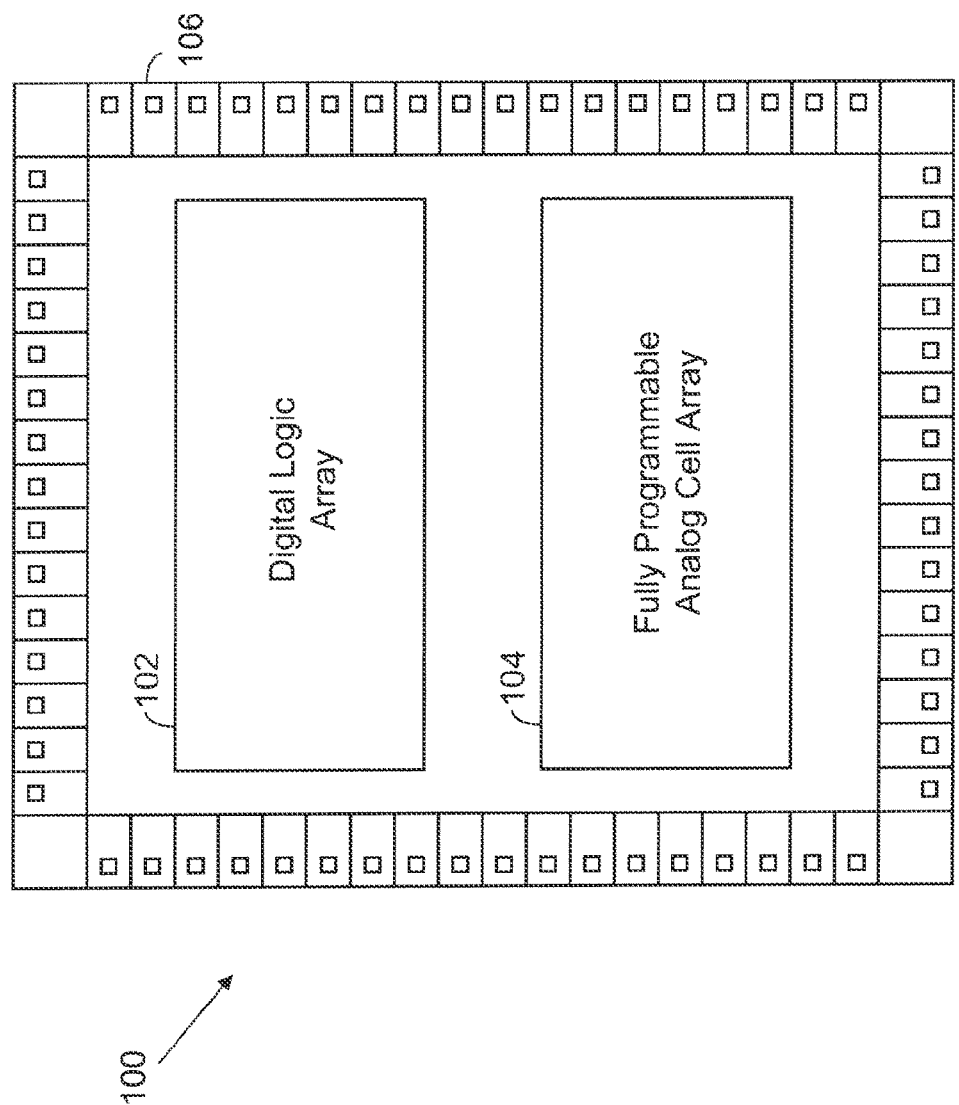
FIG. 1 illustrates a mixed signal circuit configured in accordance with an embodiment of the invention.

FIG. 1 illustrates a mixed signal circuit 100 configured in accordance with an embodiment of the invention. The mixed signal circuit 100 includes a digital logic array 102 and a fully programmable analog cell array 104. By way of example, the circuit 100 may be implemented in CMOS, BiCMOS, or SiGe.

In one embodiment, each cell of the cell array has a fixed architecture that is fully programmable. In other words, each cell is a generic fully programmable analog component with a specific topology. Preferably, the fixed architecture is common to all cells in the array. Such a configuration improves density and simplifies the design process. In alternate embodiments, there is a large percentage of cells with a fixed architecture and a small percentage of cells with different architectures that are fully programmable.

The circuit 100 also includes a ring of programmable input/output cells 106. The digital logic array 102 may utilize well-developed standard cell libraries. The invention is directed toward the combination of a known digital logic array 102 with the fully programmable analog cell array 104 and the programmable input/output cells 106.

Figure 2:
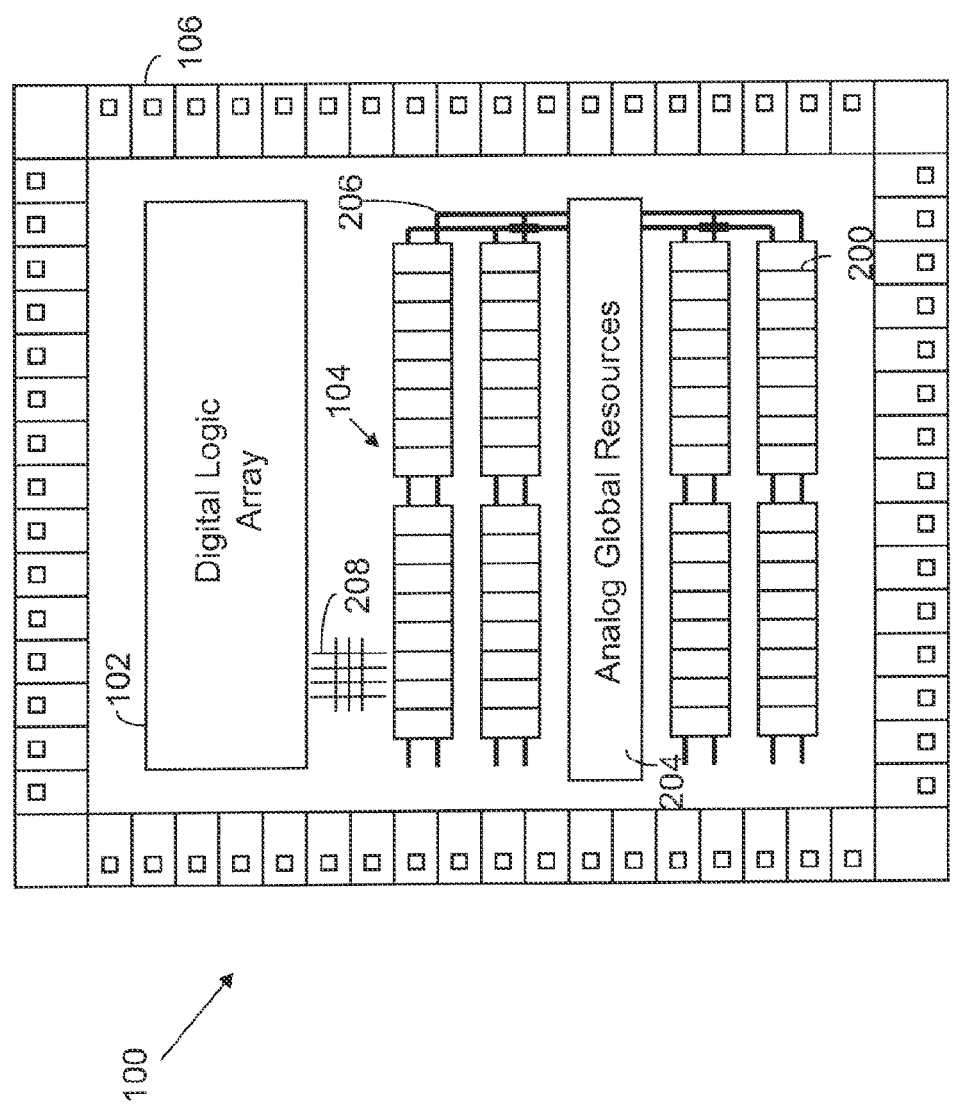
FIG. 2 is a more detailed view of the fully programmable analog cell array of FIG. 1.

FIG. 2 provides a more detailed characterization of the analog cell array 104. The array 104 includes individual cells 200. The analog cell array 104 also includes analog global resources 204 that are shared by the individual cells 200. The analog global resources 204 may include a programmable voltage reference, various current references,.various phase-locked loops, clock generators and programmable power supplies.

Programmable interconnect 206 selectively links individual cells 200 with the analog global resources 204. Additional programmable interconnect 208 is used to establish links between the digital logic array 102, input/output cells 106 and individual cells 200. The programmable interconnect may be metal programmable interconnect, anti-fuse field programmable technology, or a matrix of programmable switches.

Figure 3:
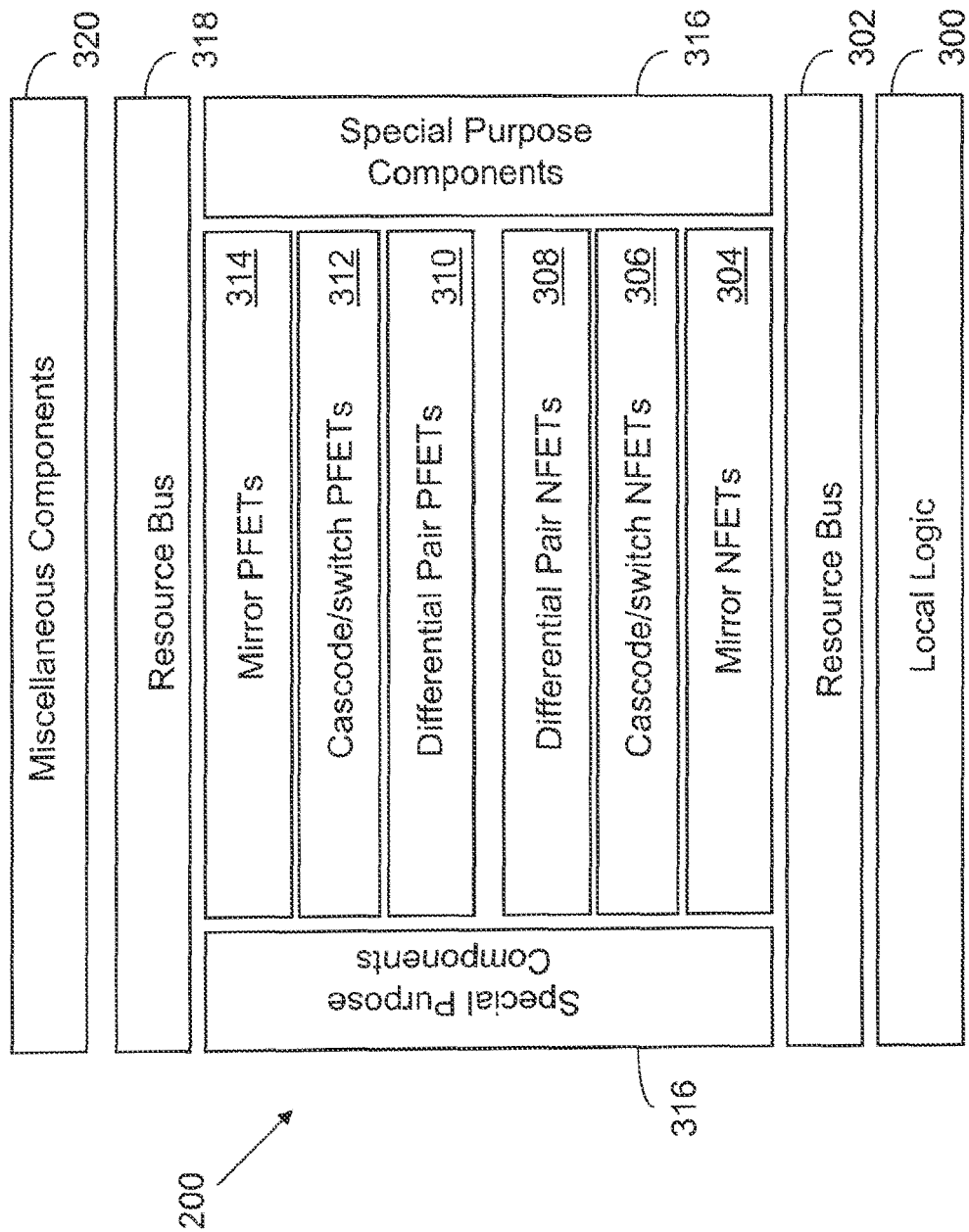
FIG. 3 illustrates a fully customizable fixed architecture analog cell utilized in accordance with an embodiment of the invention.

FIG. 3 illustrates a cell 200 configured in accordance with an embodiment of the invention. In this embodiment, the cell 200 includes a resource stack with local logic 300, a resource bus 302, mirror NFETs 304, cascode/switch NFETs 306, differential pair NFETs 308, differential pair PFETs 310, cascode/switch PFETs 312, mirror PFETs 314, a resource bus 318 and miscellaneous components 320. Special purpose components 316 are positioned on each side of the resource stack. Those skilled in the art will appreciate that the cell 200 has an architecture that corresponds to component requirements for many analog circuits. More particularly, the cell architecture corresponds to topologies commonly found in analog circuits. Thus, the cells can efficiently implement many analog circuit types.

Figure 4:
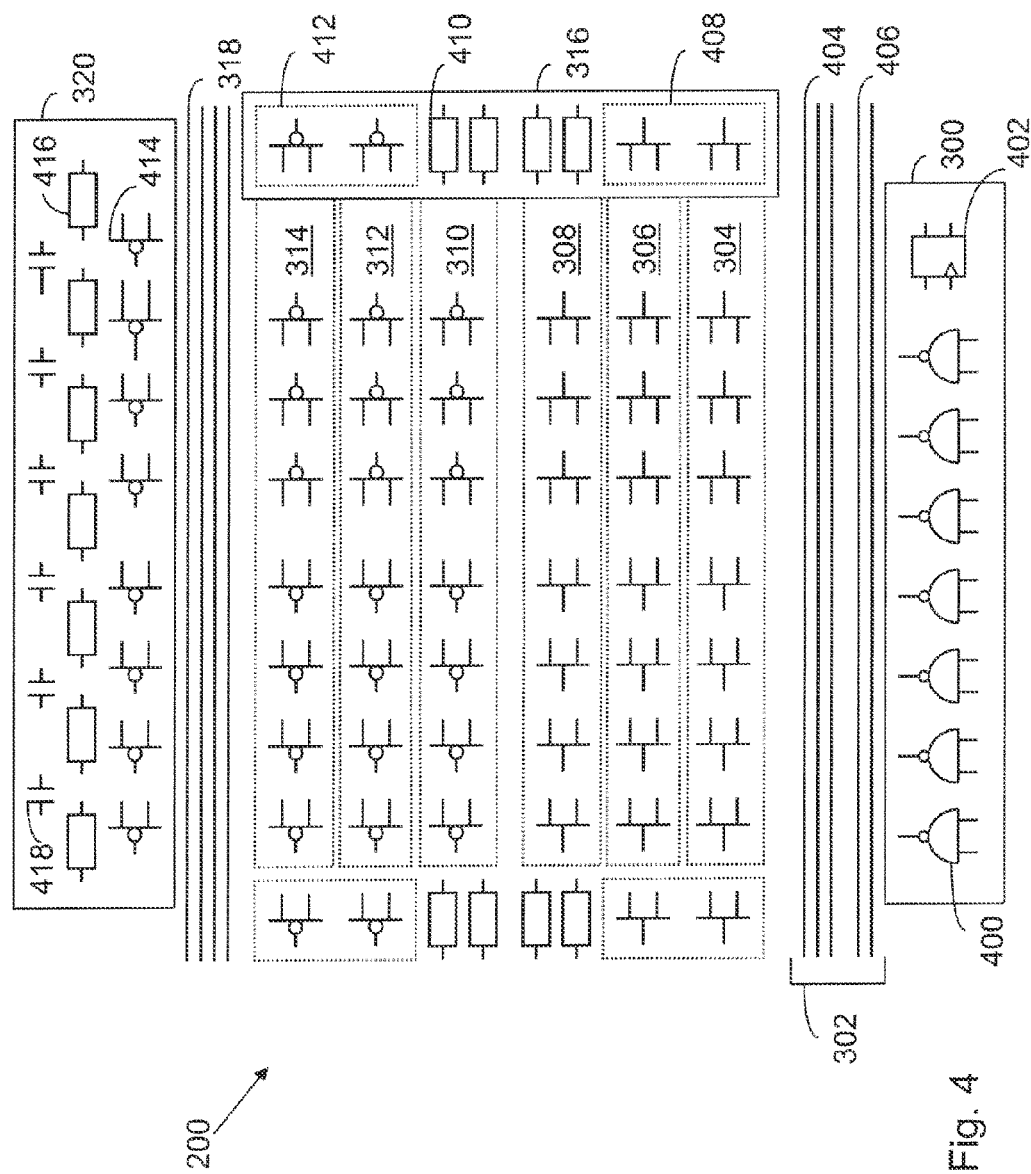
FIG. 4 is a more detailed characterization of a fully customizable fixed architecture analog cell utilized in accordance with an embodiment of the invention.

FIG. 4 is a more detailed representation of the blocks of FIG. 3. The local logic 300 may include uncommitted gates 300 and flip-flops 402 closely coupled to the analog components. The resource bus 302 is an electrical bus providing commonly required signals to each cell in the array. Some signals may be global (i.e., wired across the entire chip), or be repeated locally for mating purposes. The resource bus may also include components, such as power supplies, power mode control signals, various current and voltage references, generic clock signals, generic routing channels and the like. FIG. 4 illustrates Vss signal lines 404 and data channels 406.

FIG. 4 also illustrates mirror NFETs 304. These current mirror NFETs include a collection of matched current mirror sized transistors, a common feature of analog circuits. Preferably, the sources are physically arranged to be efficiently connected to a power supply.

Cascode/switch NFETs 306 are also illustrated in FIG. 4. This is a collection of matched transistors sized for use as cascodes in conjunction with the adjacent mirror NFETs 304. The differential pair NFETs 308 include a collection of matched transistors sized primarily for use as differential pairs. However, these transistors may be used generically within the circuit. The differential pair PFETs 310, cascode/switch PFETs 312 and mirror PFETs 314 are p-type analogs to the previously discussed differential pair NFETs 308, cascode/switch NFETs 306 and mirror NFETs 304. Similarly, the resource bus 318 may be configured as the resource bus 302. The resource bus 318 may include Vdd lines and data channels.

As shown in FIG. 4, the miscellaneous components 320 include miscellaneous PFETs 414. This collection of PFETs may include large devices primarily for use as gate capacitors and low width/length sized FETs for low current bias. High value resistors 416 oriented to match temperature compensating local and global resource references may also be used. Capacitors 418 may also be included. The capacitors may be matched high quality capacitor components sized primarily for switched capacitor circuits. Alternately, or in addition, generic capacitors may be used.

The special purpose components 316 may include special PFETs 412, which may include different voltage threshold or different voltage PFET devices. The components 316 may also include miscellaneous low value resistors 410. These resistors may include a collection of resistors, such as diffusion resistors oriented to match temperature compensating local and global resource references. These components may also be positioned between rows of cells. Special NFETs 408 may also be used in this region. The special NFETs 408 may include different voltage threshold or different voltage NFET devices. In sum, FIG. 4 illustrates a cell with various analog components available for arbitrary combination via a programmable interconnect.

Figure 5:
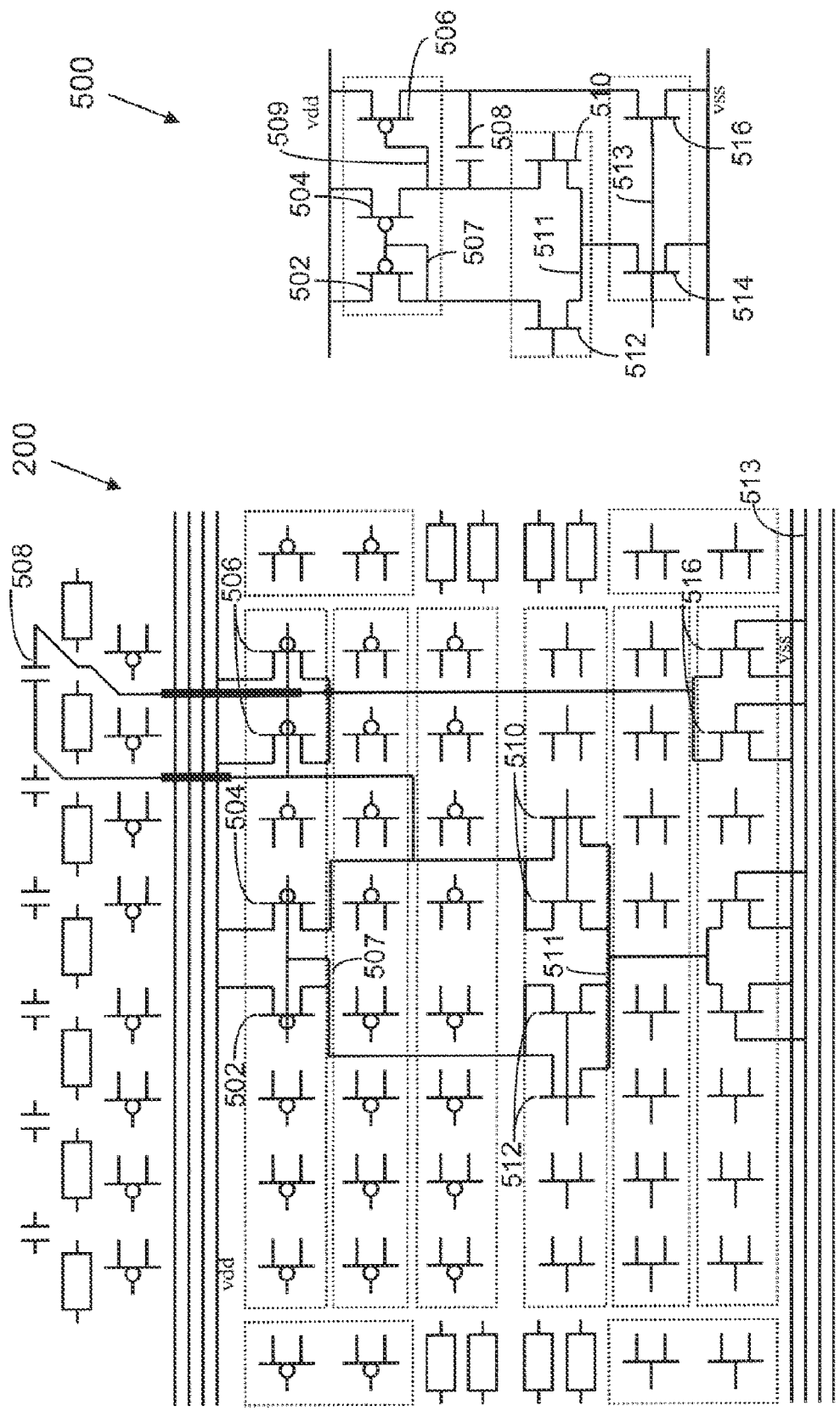
FIG. 5 illustrates the mapping of an analog circuit to a fully customizable fixed architecture analog cell in accordance with an embodiment of the invention.

FIG. 5 illustrates a typical analog circuit 500. The analog circuit 500 is mapped to a cell 200 of the invention. In particular, the figure illustrates individual components 502-516 mapped into the cell 200. Various programmable interconnects may be used to establish connections between individual components. Those skilled in the art will appreciate that any number of analog circuits may be mapped into the analog cell array, including single and two stage amplifiers, comparators, charge pumps, voltage controlled oscillator stages, level shifters and the like.

Figure 6:
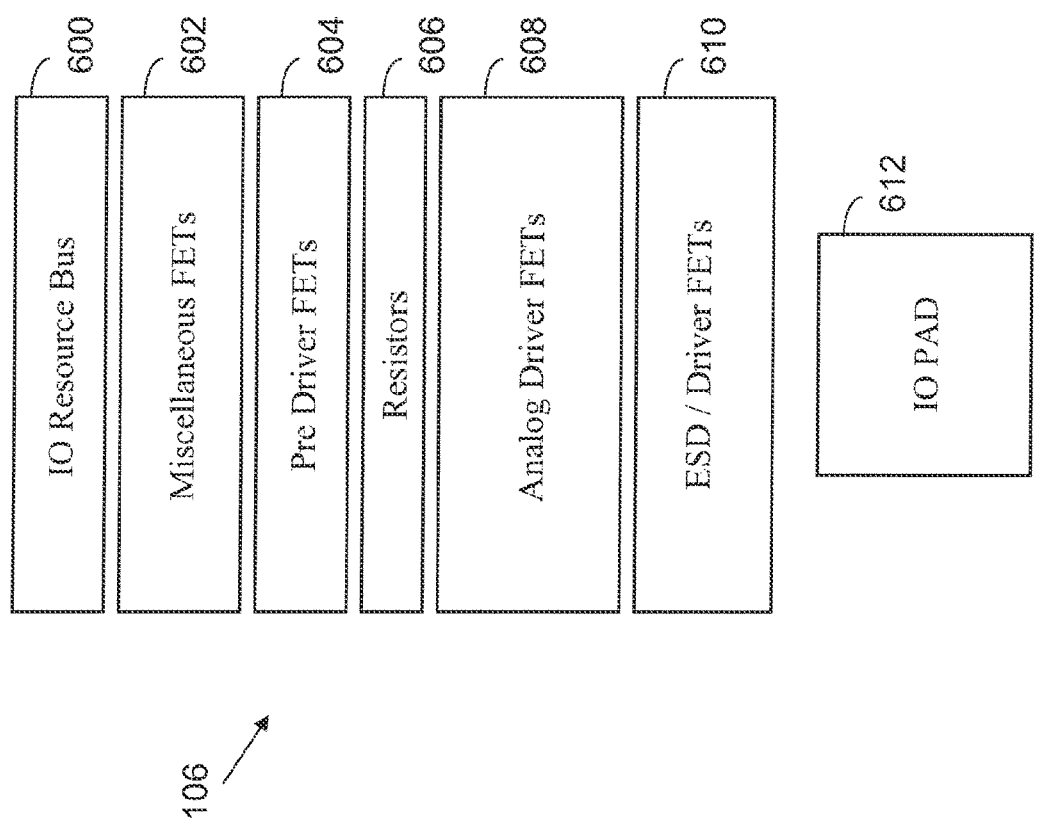
FIG. 6 illustrates a programmable input/output cell utilized in accordance with an embodiment of the invention.

FIG. 6 illustrates a programmable input/output cell 106. In this embodiment, the input/output cell 106 includes miscellaneous FETs 602 positioned adjacent to an input/output resource bus 600. The cell 106 also includes pre driver FETs 604, resistors 606, analog driver FETs 608 and electrostatic/driver FETs 610. These resources are connected to an input/output pad 612.

A method associated with the invention includes forming a digital logic array and a fully programmable analog cell array in a semiconductor. The fully programmable analog cell array is then configured with programmable interconnect to implement predetermined analog functions. Input/output cells may also be programmed with programmable interconnect to implement predetermined analog input/output functions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A mixed signal integrated circuit, comprising:
a digital logic array with standard cell libraries; and
an analog cell array, wherein each cell of the analog cell array shares a common architecture and is fully programmable, wherein the common architecture is an identical topology shared by each cell and wherein the common architecture includes local logic with gates and flip-flops closely coupled to analog components of the analog cell array.

2. The mixed signal integrated circuit of claim 1 wherein the analog cell array includes programmable interconnect to selectively link individual cells.

3. The mixed signal integrated circuit of claim 1 wherein the common architecture includes a resource bus.

4. The mixed signal integrated circuit of claim 1 wherein the common architecture includes mirror NFETs.

5. The mixed signal integrated circuit of claim 4 wherein the common architecture includes cascode NFETs.

6. The mixed signal integrated circuit of claim 5 wherein the common architecture includes differential pair NFETs.

7. The mixed signal integrated circuit of claim 1 wherein the common architecture includes differential pair PFETs.

8. The mixed signal integrated circuit of claim 7 wherein the common architecture includes cascode PFETs.

9. The mixed signal integrated circuit of claim 8 wherein the common architecture includes mirror PFETs.

10. The mixed signal integrated circuit of claim 1 wherein the common architecture includes miscellaneous components selected from PFETs, capacitors and resistors.

11. The mixed signal integrated circuit of claim 1 wherein the common architecture includes special purpose components selected from low value resistors, high value resistors, NFETs and PFETs.

12. The mixed signal integrated circuit of claim 1 further comprising a plurality of programmable input/output cells.

13. The mixed signal integrated circuit of claim 12 wherein each programmable input/output cell includes FETs.

14. The mixed signal integrated circuit of claim 12 wherein each programmable input/output cell includes pre driver FETs.

15. The mixed signal integrated circuit of claim 12 wherein each programmable input/output cell includes resistors.

16. The mixed signal integrated circuit of claim 12 wherein each programmable input/output cell includes analog driver FETs.

17. The mixed signal integrated circuit of claim 12 wherein each programmable input/output cell includes electro-static discharge FETs.

18. The mixed signal integrated circuit of claim 1 further comprising analog global resources positioned within the analog cell array.

19. The mixed signal integrated circuit of claim 18 wherein the analog global resources include components selected from a programmable voltage reference, a current reference, a phase-locked loop, a clock generator and a programmable power supply.

* * * * *